United States Patent
Cho et al.

(10) Patent No.: US 9,999,165 B2
(45) Date of Patent: Jun. 12, 2018

(54) SHIELD COVER AND ELECTRONIC DEVICE HAVING IT

(71) Applicant: Samsung Electronics Co., Ltd, Gyeonggi-do (KR)

(72) Inventors: Jae Myung Cho, Gyeonggi-do (KR); Kyunghan Kim, Gyeonggi-do (KR); Chijoon Kim, Gyeonggi-do (KR); Sukhyun Lee, Gyeonggi-do (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days. days.

(21) Appl. No.: 15/222,906

(22) Filed: Jul. 28, 2016

(65) Prior Publication Data

US 2017/0034963 A1 Feb. 2, 2017

(30) Foreign Application Priority Data

Jul. 30, 2015 (KR) .......................... 10-2015-0108056

(51) Int. Cl.
  *H05K 1/02* (2006.01)
  *H05K 9/00* (2006.01)
  *H05K 1/18* (2006.01)

(52) U.S. Cl.
  CPC ......... *H05K 9/0026* (2013.01); *H05K 1/0216* (2013.01); *H05K 1/181* (2013.01); *H05K 2201/10371* (2013.01)

(58) Field of Classification Search
  None
  See application file for complete search history.

(56) References Cited

U.S. PATENT DOCUMENTS

| 6,136,131 | A | 10/2000 | Sosnowshi | |
|---|---|---|---|---|
| 6,377,472 | B1* | 4/2002 | Fan | H05K 9/0032 |
| | | | | 174/379 |
| 6,992,901 | B1* | 1/2006 | Hung | H05K 9/0009 |
| | | | | 174/385 |
| 7,491,899 | B2* | 2/2009 | Zuehlsdorf | H04B 1/40 |
| | | | | 174/372 |
| 7,746,666 | B2* | 6/2010 | Kakinoki | H05K 9/0032 |
| | | | | 361/816 |
| 9,462,732 | B2* | 10/2016 | Robinson | H05K 9/0032 |

(Continued)

FOREIGN PATENT DOCUMENTS

KR   10-2008-0106921   12/2008

*Primary Examiner* — Xanthia C Cunningham

(57) ABSTRACT

According to various embodiments, there may be provided an electronic device including a Printed Circuit Board (PCB), at least one electronic component mounted in a shielding area of the PCB, and a shield cover formed of a metal material and fixed to an upper surface of the PCB to shield the shielding area. The shield cover may include an upper surface including a first plate and a second plate configured to be extended along a boundary of the first plate, a lateral surface which is configured to have a constant height along a boundary of the second plate, and an open portion configured to be exposed to up to one area of the first plate through the second plate from the lateral surface. An exposed area of the first plate may be exposed to a notch-shaped space configured to be more inwardly recessed than a virtual extension line of an outer boundary of the second plate in the open portion. Other various embodiments may also be possible.

20 Claims, 20 Drawing Sheets

(56) References Cited

U.S. PATENT DOCUMENTS

| | | | |
|---|---|---|---|
| 2002/0185294 A1* | 12/2002 | Shlyakhtichman | H02G 3/185 174/50 |
| 2007/0012479 A1* | 1/2007 | Vinokor | H05K 9/0032 174/382 |
| 2007/0139904 A1* | 6/2007 | English | H05K 9/0032 361/818 |
| 2007/0210082 A1 | 9/2007 | English et al. | |
| 2009/0242264 A1* | 10/2009 | Lei | H05K 9/0032 174/382 |
| 2009/0244876 A1* | 10/2009 | Li | H05K 9/0032 361/818 |
| 2011/0266045 A1* | 11/2011 | Xiong | H05K 9/0032 174/350 |
| 2017/0055340 A1* | 2/2017 | Wu | H05K 1/0216 |

\* cited by examiner

SHIELD COVER AND ELECTRONIC DEVICE HAVING IT

CROSS-REFERENCE TO RELATED APPLICATION(S) AND CLAIM OF PRIORITY

The present application is related to and claims the benefit under 35 U.S.C. § 119(a) of a Korean patent application filed in the Korean Intellectual Property Office on Jul. 30, 2015 and assigned Serial No. 10-2015-0108056, the entire disclosure of which is hereby incorporated by reference.

TECHNICAL FIELD

Various embodiments of the present disclosure relate to an electronic device, and for example, a shield cover and an electronic device including the shield cover.

BACKGROUND

An electronic device may include a Printed Circuit Board (PCB) on which various electronic function groups are mounted. A harmful electromagnetic wave may be generated when the electronic function groups operate. Therefore, an electromagnetic wave generated in the electronic device is strictly regulated. The electromagnetic wave is most common among harmful radio waves, and an environment compatibility test is carried out to test whether the electromagnetic wave is suitable for the environment, i.e., ElectroMagnetic Compatibility (EMC).

Such an EMC test is divided into an Electromagnetic Interference (EMI) test and an ElectroMagnetic Susceptibility (EMS) test, and is strictly regulated because it is harmful to a human body. Therefore, there are many methods proposed to prevent an electromagnetic wave generated in an electronic function group due to the strict regulation of the EMC test.

One of these methods may include a method of placing one or more shield covers to shield one or more electronic function groups mounted on one PCB. Further, there is ongoing discussion on various methods for effectively removing the placed shield cover to replace or repair the electronic function group or the like.

According to various embodiments, various methods for placing the shield cover on the PCB are provided. Such a placement method may include a screw fastening type connecting method, a clip type connecting method, a frame type connecting method, a method of directly soldering on the PCB, or the like.

A mechanical connecting method is a method in which the shield can is fastened to the PCB by using a plurality of screws. The clip type connecting method is a method in which a clip is mounted to be electrically connected to a ground line of the PCB along an outer boundary of the shield can, and thereafter the shield can is fixed to the clip. The frame type connecting method is a method in which an additional shield frame is installed to surround components on the PCB, and the shield cover is fixed to a frame.

However, an intermediary medium (e.g., a fixing clip, a shield frame, etc.) electrically connected or fixed to a ground portion of the PCB is provided to fix the shield cover to the PCB in the aforementioned methods, and thus an installation space is required, which is problematically against a current trend in which the electronic device is becoming slim.

Recently, since an end portion of the shield cover is directly fixed to the PCB in a soldering process without an additional intermediary medium, a cost is reduced and the device becomes slim. In this example, when an electronic function group in a shielding area which is shielded from an external space by the shield cover is required to be replaced or repaired, maintenance may be performed after removing at least one portion of an upper area of a soldering portion of the shield cover in a tearing manner without having to separate the soldering portion of the shield cover (without having to entirely remove the shield cover).

However, this method has a problem in that the shield cover is entirely transformed or a crack is generated in the soldering portion when force is excessively imposed for a removal since a portion at which the shield cover starts to be removed and a portion remaining after the removal are not clearly distinguished.

SUMMARY

Various embodiments of the present disclosure may provide a shield cover, and an electronic device including the shield cover.

According to various embodiments, there may be provided a shield cover implemented to avoid or reduce a transformation of remaining portions when one area of the shield cover is removed for maintenance, and an electronic device including the shield cover.

According to various embodiments, there may be provided a shield cover implemented to easily remove one area of the shield cover for maintenance, and an electronic device including the shield cover.

According to various embodiments, there may be provided an electronic device including: a housing including a first surface directed in a first direction, and a second surface directed in a second direction opposite to the first direction; a Printed Circuit Board (PCB) included in the housing, and including a first surface directed in the first direction and a second surface directed in the second direction; at least one electronic component disposed on the second surface of the PCB; and a shield structure for electromagnetically shielding the at least one electronic component, wherein the shield structure includes a metal plate which covers the at least one electronic component, from a top view of the second surface of the PCB, wherein the metal plate includes: a first portion for at least partially forming an external area of the metal plate, and comprising at least one open area; and a second portion for at least partially forming a central area of the metal plate, and comprising a second portion which more protrudes in the second direction than the first portion, from a side view of the metal plate, wherein a part of the second portion is disposed to the open area of the first portion, and from a top view of the metal plate, the part of second portion protrudes or is recessed more than a virtual line defined by a part of the first portion in proximity to the open area.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1A:
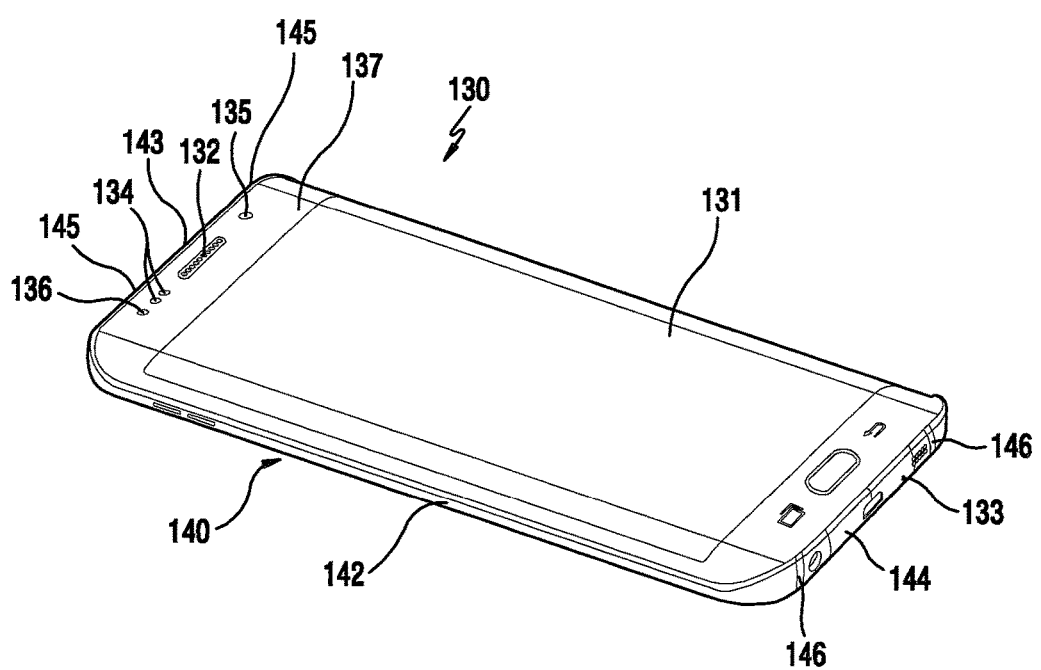
FIG. 1A illustrates a front perspective view of an electronic device to which a shield cover is applied according to various embodiments of the present disclosure.

FIGS. 1A through 10, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, various embodiments of the present document are described with reference to the accompanying drawings. It should be understood, however, that it is not intended to limit the various embodiments of the present document to the particular form disclosed, but, on the contrary, it is intended to cover all modifications, equivalent, and alternatives falling within the spirit and scope of the various embodiments of the present document. Like reference numerals denote like components throughout the drawings.

An expression "have", "may have", "include" or "may include" or the like used in the present document is intended to indicate a presence of a corresponding characteristic (e.g., a number, a function, an operation, or a constitutional element such as a component), and should be understood that there are additional possibilities of one or more other characteristics.

In the present document, an expression "A or B", "A and/or B", or "one or more of A and/or B" or the like may include all possible combinations of items enumerated together. For example, "A or B", "at least one of A and B", or "at least one of A or B" may indicate all embodiments where: (1) at least one A is included; (2) at least one B is included; and (3) at least one A and at least one B are both included.

In the various embodiments, although expressions such as "$1^{st}$", "$2^{nd}$", "first", and "second" may be used to express various constitutional elements, it is not intended to limit the corresponding constitutional elements. The above expressions may be used to distinguish one constitutional element from another constitutional element. For example, a $1^{st}$ user device and a $2^{nd}$ user device are both user devices, and indicate different user devices. For example, a $1^{st}$ constitutional element may be termed a $2^{nd}$ constitutional element, and similarly, the $2^{nd}$ constitutional element may be termed the $1^{st}$ constitutional element without departing from the scope of the present document.

When a certain constitutional element (e.g., the 1st constitutional element) is mentioned as being "operatively or communicatively coupled with/to" or "connected to" a different constitutional element (e.g., the 2 constitutional element), it is to be understood that the certain constitutional element is directly coupled with/to another constitutional element or can be coupled with/to the different constitutional element via another constitutional element (e.g., a 3rd constitutional element). On the other hand, when the certain constitutional element (e.g., the 1st constitutional element) is mentioned as being "directly coupled with/to" or "directly connected to" the different constitutional element (e.g., the 2 constitutional element), it may be understood that another constitutional element (e.g., the 3 rd constitutional element) is not present between the certain constitutional element and the different constitutional element.

An expression "configured to" used in the present document may be interchangeably used with, for example, "suitable for", "having the capacity to", "designed to", "adapted to", "made to", or "capable of" according to a situation. A term "configured to" may not imply only "specially designed to" in a hardware manner. Instead, in a certain situation, an expressed "a device configured to" may imply that the device is "capable of" together with other devices or components. For example, "a processor configured to perform A, B, and C" may imply a dedicated processor (e.g., an embedded processor) for performing a corresponding operation or a generic-purpose processor (e.g., Central Processing Unit (CPU) or an application processor (AP)) capable of performing corresponding operations by executing one or more software programs stored in a memory device.

Terms used in the present document are for the purpose of describing particular embodiments only and are not intended to limit other embodiments. A singular expression may include a plural expression unless there is a contextually distinctive difference. Unless otherwise defined, all terms (including technical and scientific terms) used herein have the same meaning as commonly understood by those ordinarily skilled in the art to which various embodiments of the present document belong. It will be further understood that terms, such as those defined in commonly used dictionaries, should be interpreted as having a meaning that is consistent with their meaning in the context of the relevant art, and will not be interpreted in an idealized or overly formal sense unless expressly so defined herein. Optionally, the terms defined in the present document should not be interpreted to exclude the embodiments of the present document.

An electronic device according to various embodiments of the present document may include, for example, at least one of a smart phone, a tablet Personal Computer (PC), a mobile phone, a video phone, an e-book reader, a desktop PC, a laptop PC, a netbook computer, a workstation, a server, a Personal Digital Assistant (PDA), a Portable Multimedia Player (PMP), a MPEG-1 Audio Layer 3 (MP3) player, a mobile medical device, a camera, and a wearable device. According to various embodiments, the wearable device may include at least one of an accessory-type device (e.g., a watch, a ring, a bracelet, an anklet, a necklace, glasses, contact lenses, or a Head-Mounted Device (HMD)), a fabric- or clothes-integrated device (e.g., electronic clothes), a body attaching-type device (e.g., a skin pad or tattoo), or a body implantable device (e.g., an implantable circuit).

According to certain embodiments, the electronic device may be a home appliance. The home appliance may include, for example, at least one of a TeleVision (TV), a Digital Video Disk (DVD) player, an audio player, a refrigerator, an air conditioner, a cleaner, an oven, a microwave oven, a washing machine, an air purifier, a set-top box, a home automation control panel, a security control panel, a TV box (e.g., Samsung HomeSync®, Apple TV®, or Google TV®), a game console (e.g., Xbox®, PlayStation®), an electronic dictionary, an electronic key, a camcorder, and an electronic picture frame.

According to other embodiments, the electronic device may include at least one of various medical devices (e.g., various portable medical measuring devices (e.g., a blood sugar measuring device, a hear rate measuring device, a blood pressure measuring device, a body temperature measuring device, etc.), Magnetic Resonance Angiography (MRA), Magnetic Resonance Imaging (MRI), Computed Tomography (CT), imaging equipment, ultrasonic instrument, etc.)), a navigation device, a Global Positioning System (GPS) receiver, an Event Data Recorder (EDR), a Flight Data Recorder (FDR), a car infotainment device, an electronic equipment for ship (e.g., a vessel navigation device, a gyro compass, etc.), avionics, a security device, a car head unit, an industrial or domestic robot, an Automatic Teller's Machine (ATM) of financial institutions, Point Of Sales (POS) of shops, and Internet of things (e.g., a light bulb, various sensors, an electric or gas meter, a sprinkler device, a fire alarm, a thermostat, a streetlamp, a toaster, a fitness equipment, a hot water tank, a heater, a boiler, etc.).

According to certain embodiments, the electronic device may include at least one of furniture or a part of building/constructions, an electronic board, an electronic signature input device, a projector, and various measurement machines (e.g., water supply, electricity, gas, propagation measurement machine, etc.). The electronic device according to various embodiments of the present disclosure may be one or more combinations of the aforementioned various devices. The electronic device according to certain embodiments may be a flexible device. Further, the electronic device according to one embodiment of the present document is not limited to the aforementioned devices, and may include a new electronic device depending on technical progress.

Hereinafter, an electronic device according to various embodiments will be described with reference to the accompanying drawings. The term 'user' used in the present document may refer to a person who uses the electronic device or a device which uses the electronic device (e.g., an Artificial Intelligence (AI) electronic device).

FIG. 1A is a front perspective view of an electronic device 130 to which a shield cover (100 of FIG. 1C) is applied according to various embodiments of the present disclosure.

Referring to FIG. 1A, a display 131 may be disposed to a front side 137 of the electronic device 130. A speaker device 132 for receiving voice of an opposite party may be disposed to an upper side of the display 131. A microphone device 133 for transmitting voice of a user of the electronic device to the opposite part may be disposed to a lower side of the display 131.

According to one embodiment, components for performing various functions of the electronic device 130 may be disposed in proximity to a portion to which the speaker device 132 is disposed. The components may include at least one sensor module 134. The sensor module 134 may include, for example, at least one of an illumination sensor (e.g., an optical sensor), a proximity sensor, an infrared sensor, and an ultra sonic sensor. According to one embodiment, the component may include a camera device 135. According to one embodiment, the component may include an LED indicator 136 for indicating state information of the electronic device 130 to the user.

According to various embodiments, the electronic device 130 may include the metal bezel 140 (e.g., contributed as at least one area of a metal housing). According to one embodiment, the metal bezel 140 may be disposed along an edge of the electronic device 130, and may be extended up to at least one area of a rear surface of the electronic device 130 extended from the edge. According to one embodiment, the metal bezel 140 defines a thickness of the electronic device along the edge of the electronic device 130, and may be formed in a closed-loop shape. However, the present disclosure is not limited thereto, and thus the metal bezel 140 may also be formed to be served as at least one part of the thickness of the electronic device 130. According to one embodiment, the metal bezel 140 may be disposed only or mostly in at least one area of the edge of the electronic device 130. According to one embodiment, the metal bezel 140 may include at least one segment portions 145 and 146, and unit bezel portions 143 and 144 separated by the segment portions 145 and 146 may be utilized as an antenna radiator operating in at least one frequency band of the present disclosure.

According to various embodiments, the metal bezel 140 has a closed-loop shape along the edge, and may be disposed to be served as the entire thickness of the electronic device 130. According to one embodiment, when the electronic device 130 is viewed from the front, the metal bezel 140 may be formed of a right bezel portion 211, a left bezel portion 212, an upper bezel portion 213, and a lower bezel portion 214. Herein, the aforementioned upper and lower bezel portions 143 and 144 may be contributed as unit bezel portions formed by the segment portions 145 and 146.

According to various embodiments, although the metal bezel 140 in which a housing of the electronic device 130 is partially formed of a metal material is described, the present disclosure is not limited thereto. For example, the shield cover according to an embodiment of the present disclosure may also be applied to an electronic device at least partially formed of at least one material among a synthetic resin material, a glass material, and a composite fiber material.

Figure 1B:
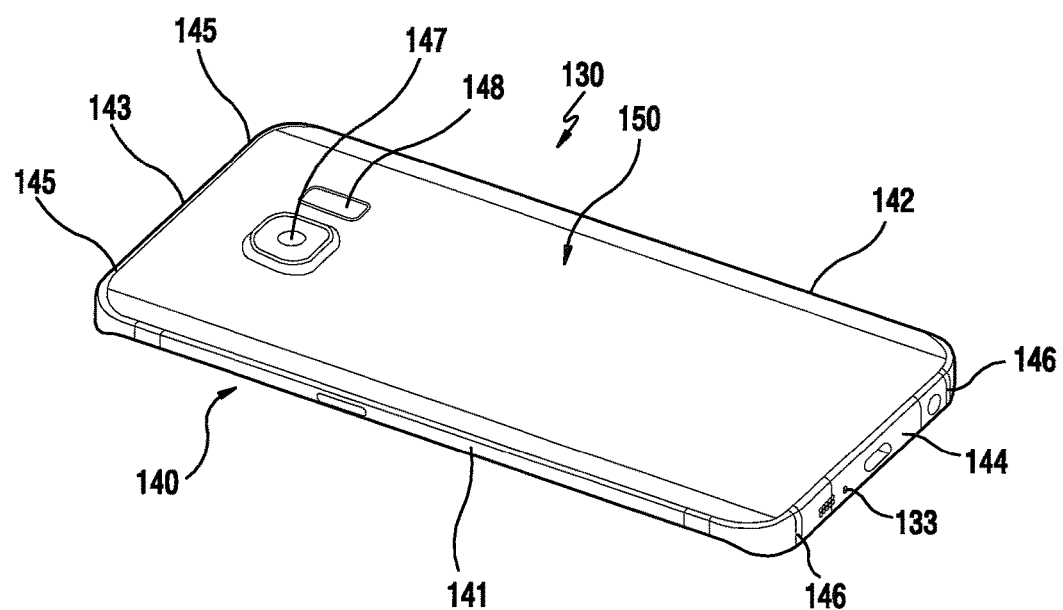
FIG. 1B illustrates a rear perspective view of an electronic device to which a shield cover is applied according to various embodiments of the present disclosure.

FIG. 1B is a rear perspective view of an electronic device 130 to which a shield cover (100 of FIG. 1C) is applied according to various embodiments of the present disclosure.

Referring to FIG. 1B, a cover member 150 may be further disposed to a rear surface of the electronic device 130. The cover member 150 may be a battery cover for protecting a battery pack disposed to the electronic device 130 in a detachable manner and for beautifying an outer appearance of the electronic device 130. However, without being limited thereto, the cover member 150 may be integrated to the electronic device 130 so as to be contributed as a rear housing of the electronic device 130. According to one embodiment, the cover member 150 may be formed of various materials such as metal, glass, composite materials, synthetic resin, or the like. According to one embodiment, a camera device 147 and a flash 148 may be disposed to the rear surface of the electronic device 130.

According to various embodiments, if a battery pack is applied to an inner portion of the electronic device 130 in an integral manner, the cover member 150 may be replaced with the rear housing of the electronic device 130.

Figure 1C:
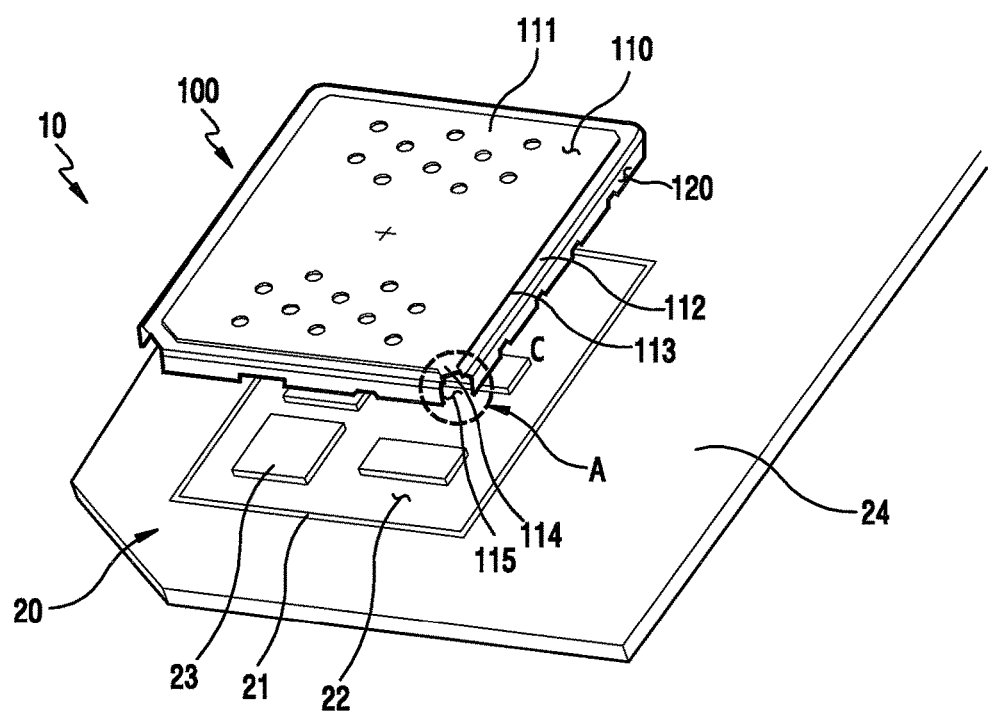
FIG. 1C illustrates a structure of a shield device including a shield cover according to various embodiments of the present disclosure.

FIG. 1C illustrates a structure of a shield device 10 including a shield cover 100 according to various embodiments of the present disclosure.

Referring to FIG. 1C, the shield device 10 may include a PCB 20 includinga solder line 21 and the shield cover 100 formed of a metal material and soldered to the solder line 21 to shield at least one electronic component 23 mounted on the PCB 20. According to one embodiment, the shield cover 100 may be formed of a conductive metal material such as SUS, aluminum, or the like.

According to various embodiments, the solder line 21 is disposed to be exposed to an upper surface 24 of the PCB 20, and may be in a state of being electrically connected to a ground portion of the PCB 20. According to one embodiment, the solder line 21 may form a closed area corresponding to a boundary of the shield cover 100 disposed to an upper portion thereof. According to one embodiment, at least one electronic component may be mounted (for example, with a Surface Mount Technology (SMT), etc.) inside an area formed by the solder line 21.

According to various embodiments, the shield cover 100 may include an upper surface 110 roughly formed in a size corresponding to a shielding area 22 formed by the solder line 21 to the upper surface 24 of the PCB 20 and a lateral surface 120 formed to have the same height along a boundary of the upper surface 110.

According to various embodiments, the upper surface 110 may include a first plate 111 to be removed for a repairing purpose and a second plate 112 extended from the lateral surface 120 remaining on the PCB 20 even after the first plate 111 is removed. According to one embodiment, the second plate 112 may be extended in a central direction of the shield cover 100 along a boundary of the lateral surface 120. According to one embodiment, the first plate 111 may have the second plate 112 as a boundary, and may be roughly contributed as at least one area of a central portion.

According to various embodiments, a lower portion of the lateral surface 120 of the shield cover 100 may be disposed to be in contact with the solder line 21 of the PCB 20, and may be fixed to the solder line 21 of the PCB 20 through a soldering process. According to one embodiment, the solder liner 21 may be electrically connected to a ground portion of the PCB 20. According to one embodiment, the solder liner 21 may be disposed to be exposed to the PCB 20, and may have a conductive pattern formed to be electrically connected to the ground portion.

According to various embodiments, the shield cover 100 may be roughly formed in a rectangular shape. According to one embodiment, an open portion 115 which is open to up to the first plate 111 may be formed to at least one corner of the shield cover 100. According to one embodiment, an operator may separate the first plate from the second plate 112 in a tearing manner by lifting a removal starting portion 114 of the first plate 111 exposed to the open portion 115 in an upward direction by applying specific pressure.

According to various embodiments, a boundary line between the first plate 111 and the second plate 112 may be formed as a cut line 113. This is because the first plate 111 is removed by tearing up to a desired area in the upper surface 110 of the shield cover 100 with respect to the second plate 112. Therefore, the first plate 111 may be formed to be extended from the second plate 112, whereas the cut line 113 may be formed to have a thinner thickness than the first plate 111 and the second plate 112. Such a configuration will be described below in greater detail.

According to various embodiments, the first plate 111 may have a higher height than the second plate 112. However, the present disclosure is not limited thereto, and thus the first plate 111 may have a lower surface than the second plate 112, or the first plate 111 and the second plate 112 may be formed to be identical to each other.

According to various embodiments, the open portion 115 in an area A of the shield cover 100 externally exposes the removal starting portion 114 to start the removal of the first plate 111 but is not formed on an extension line with respect to an outer line of the second plate 112, and force for removing the first plate 111 may be less imposed to the second plate 112 by a notch formed by the second plate 112. Due to such a notch structure, it can be easily removed by holding the removal starting portion 114 of the first plate 111 and lifting it in an upward direction, and the second plate 112 persistently fixed to the PCB 20 can be avoided or reduced not only from transformation but also from a crack phenomenon which may occur in a soldering area in which the lateral surface 120 is fixed to the solder line 21 of the PCB 20.

Figure 2A:
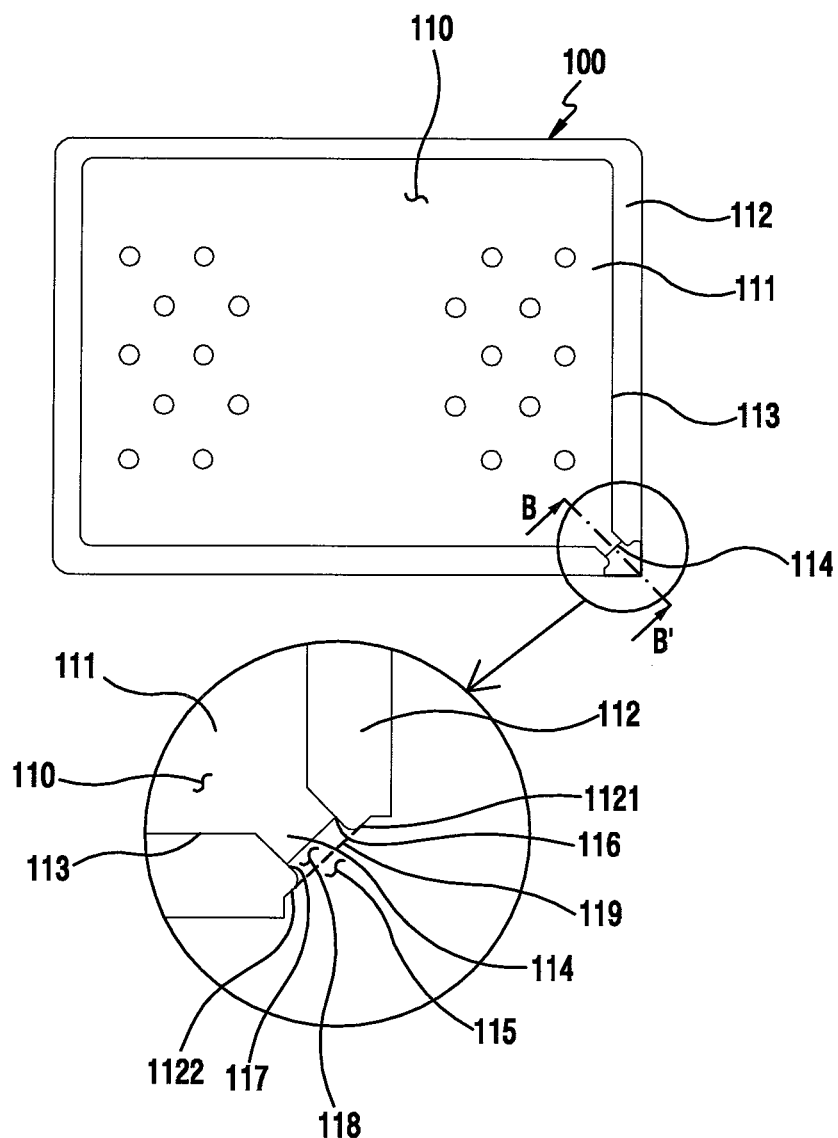
FIG. 2A illustrates a structure of a shield cover according to various embodiments of the present disclosure.

FIG. 2A illustrates a structure of a shield cover 100 according to various embodiments of the present disclosure.

Referring to FIG. 2A, the shield cover 100 may include an upper surface 110 formed in a roughly rectangular shape and a lateral surface (120 of FIG. 1C) formed to have the same height along a boundary of the upper surface 110. According to various embodiments, the shield cover 100 of FIG. 2A is one example of a shield cover similar to or different from the shield cover 100 of FIG. 1C.

According to various embodiments, the upper surface 110 may include a first plate 111 to be removed for a repairing purpose and a second plate 112 extended from the lateral surface 120 remaining on a PCB 20 even after the first plate 111 is removed. According to one embodiment, the second plate 112 may be extended in a central direction of the shield cover 100 along a boundary of the lateral surface 120. According to one embodiment, the first plate 111 may have the second plate 112 as a boundary, and may be roughly contributed as at least one area of a central portion.

According to various embodiments, an open portion 115 which is open to up to the first plate 111 in order to be removed for a repairing purpose may be formed to at least one corner of the shield cover 100. According to one embodiment, the first plate 111 may be separated from the second plate 112 in a tearing manner by lifting a removal starting portion 114 of the first plate 111 exposed to the open portion 115 in an upward direction by applying specific pressure.

According to various embodiments, a boundary line between the first plate 111 and the second plate 112 may be formed as a cut line 113. This is because the first plate 111 is removed by tearing up to a desired area in the upper surface 110 of the shield cover 100 with respect to the second plate 112.

According to various embodiments, the shield cover 100 may externally expose the removal starting portion 114 to start the removal of the first plate 111 by the open portion 115. According to one embodiment, the removal starting portion 114 is not formed on a virtual extension line 119 which is the same as external lines 1121 and 1122 of the second plate 112 exposed to the open portion 115, and force for removing the first plate 111 may be less imposed to the second plate 112 by a notch-shaped space 118 formed by the second plate 112. According to one embodiment, the notch-shaped space 118 may have a shape which is recessed in a central direction of the shield cover 110 in comparison with the virtual extension line 119 which is the same as the external lines 1121 and 1122 of the second plate 112. Due to the notch-shaped space 118, it can be easily removed by holding the removal starting portion 114 of the first plate 111 and lifting it in an upward direction, and the second plate 112 persistently fixed to the PCB 20 can be avoided or reduced not only from transformation but also from a crack phenomenon which may occur in a soldering area in which the lateral surface 120 is fixed to the solder line 21 of the PCB 20.

According to various embodiments, the external lines 1121 and 1122 of the second plate 112 exposed to the open portion 115 of the shield cover 100 are not aligned with an end portion of the removal starting portion 114. According to one embodiment, the removal starting portion 114 of the first plate 111 may be disposed to the notch-shaped space 118 which is introduced internally in comparison with the external lines 1121 and 1122 of the second plate 112. According to one embodiment, when the removal starting portion 114 of the first plate 111 is lifted in an upward direction by the aforementioned space 118, only or primarily the first plate 111 can be easily separated from the second plate 112 by both-side corners 116 and 117 formed by the removal starting portion 114 in the space 118 and the second plate 112.

Figure 2B:
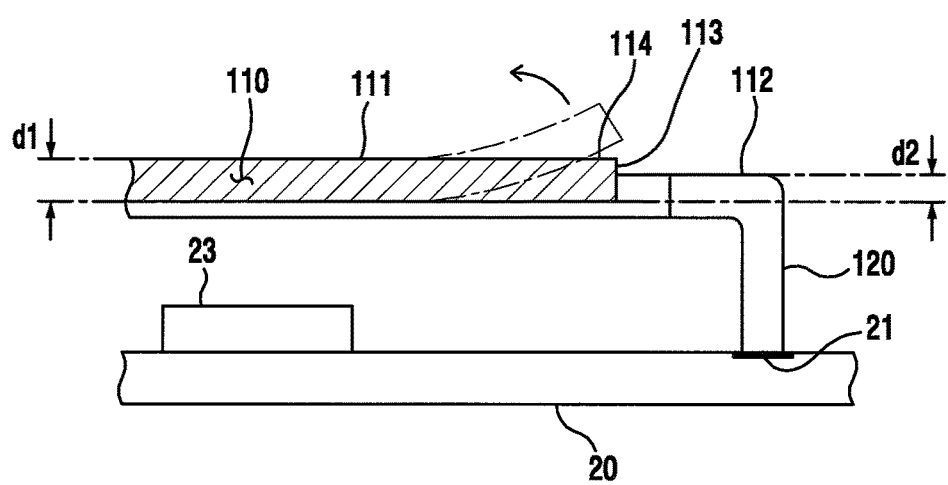
FIG. 2B is an operational diagram illustrating a state in which a shield cover is partially removed according to various embodiments of the present disclosure.

FIG. 2B is an operational diagram illustrating a state in which a shield cover 100 is partially removed according to various embodiments of the present disclosure. According to one embodiment, FIG. 2B illustrates a cross-section viewed along the line B-B' of FIG. 2A.

Referring to FIG. 2B, the shield cover 100 may be disposed on a PCB 20 on which at least one electronic component 23 is mounted, and a lower end portion of a lateral surface 120 of the shield cover 100 may be fixed to a solder line 21 of the PCB 20 through a soldering process. According to one embodiment, a removal starting portion 114 of a first plate 111 of the shield cover 100 may be easily separated from a second plate 112 by force of lifting in an upward direction (an arrow direction in the figure) due to the aforementioned notch-shape structure.

According to various embodiments, a cut line 113 contributed as a boundary line of the first plate 111 and the second plate 112 may be formed to have a thinner thickness than the first plate 111 and the second plate 112. According to one embodiment, a thickness d2 of the cut line 113 may be formed to be relatively thinner than a thickness d1 of the first plate 111 and the second plate 112. According to one embodiment, the cut line 113 may be formed such that the first plate 111 upwardly protrudes in comparison with the second plate 112 by being pressed in an upward direction in an inner lateral surface of the shield cover 100. However, the present disclosure is not limited thereto, and thus the cut line 113 may be formed by being pressed in a downward direction from an outer lateral surface of the shield cover 100.

Figure 3A:
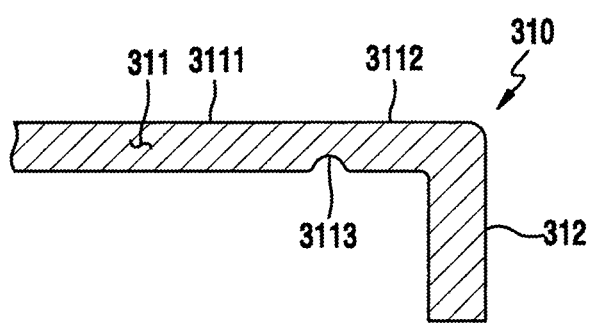
FIG. 3A to FIG. 3C are cross-sectional views illustrating a shape of a cut line of shield covers according to various embodiments of the present disclosure.
Figure 3B:
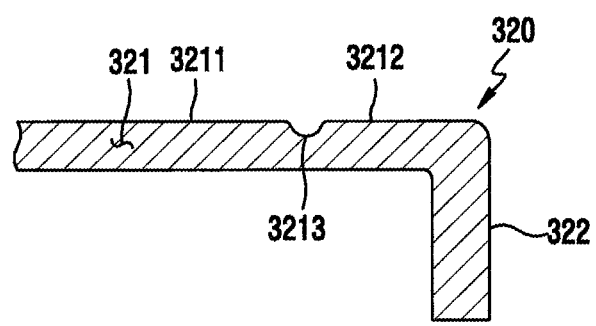
Figure 3C:
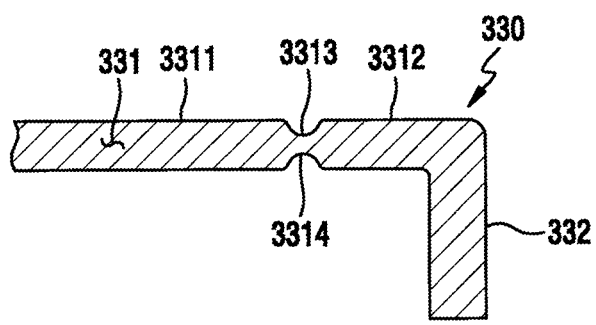

FIG. 3A to FIG. 3C are cross-sectional views illustrating a shape of a cut line of shield covers 310, 320, and 330 according to various embodiments of the present disclosure.

Referring to FIG. 3A, the shield cover 310 may include an upper surface 311 formed in a roughly rectangular shape and a lateral surface 312 formed to have the same height along a boundary of the upper surface 311.

According to various embodiments, the upper surface 311 may include a first plate 3111 to be removed for a repairing purpose and a second plate 3112 extended from the lateral surface 312 remaining on a PCB even after the first plate 3111 is removed. According to one embodiment, the second plate 3112 may be extended in a central direction of the shield cover 100 along a boundary of the lateral surface 312. According to one embodiment, the first plate 3111 may have the second plate 3112 as a boundary, and may be roughly contributed as at least one area of a central portion.

According to various embodiments, the first plate 3111 may include a cut line in order to be easily removed from the second plate 3112. The cut line may be formed in a thinner thickness than the first plate 3111 and the second plate 3112. However, in the present embodiment, the cut line is not exposed to the upper surface 311 of the shield cover 310, and may be formed by a cut notch 3113 on a lower surface of the shield cover 310. According to one embodiment, a region of the first plate 3111 to be removed from the upper surface 311 of the shield cover 310 by the cut notch 3113 may be determined.

Referring to FIG. 3B, the shield cover 320 may include an upper surface 321 formed in a roughly rectangular shape and a lateral surface 322 formed to have the same height along a boundary of the upper surface 321.

According to various embodiments, the upper surface 321 may include a first plate 3211 to be removed for a repairing purpose and a second plate 3212 extended from the lateral surface 322 remaining on a PCB even after the first plate 3211 is removed. According to one embodiment, the second plate 3212 may be extended in a central direction of the shield cover 100 along a boundary of the lateral surface 322. According to one embodiment, the first plate 3211 may have the second plate 3212 as a boundary, and may be roughly contributed as at least one area of a central portion.

According to various embodiments, the first plate 3211 may include a cut line in order to be easily removed from the second plate 3212. The cut line may be formed in a thinner thickness than the first plate 3211 and the second plate 3212. However, in the present embodiment, the cut line may be formed by a cut notch 3213 disposed to be exposed to the upper surface 321 of the shield cover 320. According to one embodiment, a region of the first plate 3211 to be removed from the upper surface 321 of the shield cover 320 by the cut notch 3213 may be determined.

Referring to FIG. 3C, the shield cover 330 may include an upper surface 331 formed in a roughly rectangular shape and a lateral surface 332 formed to have the same height along a boundary of the upper surface 331.

According to various embodiments, the upper surface 331 may include a first plate 3311 to be removed for a repairing purpose and a second plate 3312 extended from the lateral surface 332 remaining on a PCB even after the first plate 3311 is removed. According to one embodiment, the second plate 3312 may be extended in a central direction of the shield cover 100 along a boundary of the lateral surface 332. According to one embodiment, the first plate 3311 may have the second plate 3312 as a boundary, and may be roughly contributed as at least one area of a central portion.

According to various embodiments, the first plate 3311 may include a cut line in order to be easily removed from the second plate 3312. The cut line may be formed in a thinner thickness than the first plate 3311 and the second plate 3312. However, in the present embodiment, the cut line may be formed by cut notches 3313 and 3314 disposed respectively to be disposed to the upper surface 331 of the shield cover 330 and a lower surface facing the upper surface. According to one embodiment, a region of the first plate 3311 to be removed from the upper surface 331 of the shield cover 330 by the cut notches 3313 and 3314 may be determined.

Figure 4A:
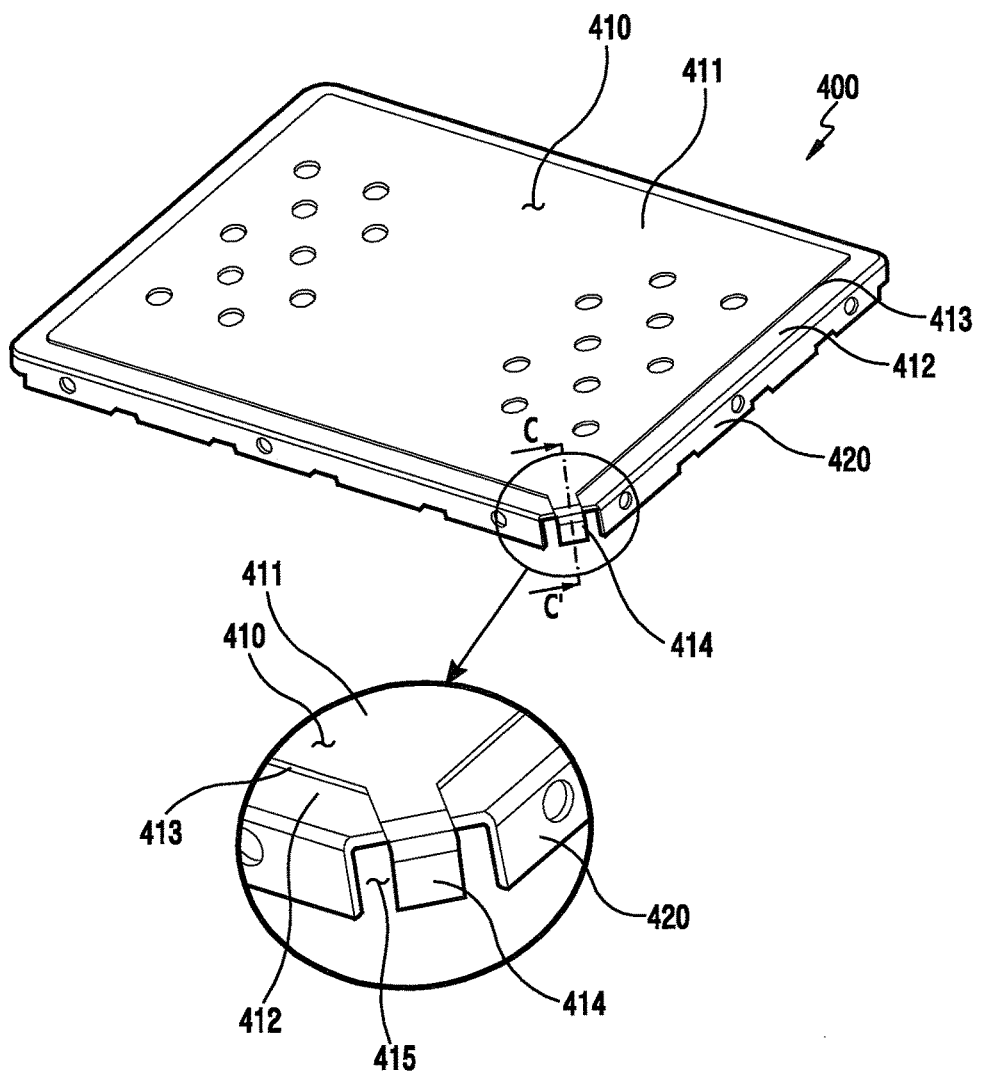
FIG. 4A illustrates a structure of a shield cover according to various embodiments of the present disclosure.

FIG. 4A illustrates a structure of a shield cover 400 according to various embodiments of the present disclosure.

Referring to FIG. 4A, the shield cover 400 may include an upper surface 410 formed in a roughly rectangular shape and a lateral surface 420 formed to have the same height along a boundary of the upper surface 410.

According to various embodiments, the upper surface 410 may include a first plate 411 to be removed for a repairing purpose and a second plate 412 extended from the lateral surface 420 remaining on a PCB even after the first plate 411 is removed. According to one embodiment, the second plate 412 may be extended in a central direction of the shield cover 400 along a boundary of the lateral surface 420. According to one embodiment, the first plate 411 may have the second plate 412 as a boundary, and may be roughly contributed as at least one area of a central portion.

According to various embodiments, an open portion 415 which is open to up to the first plate 411 may be formed to at least one corner of the shield cover 400. According to one embodiment, the first plate 411 may be separated from the second plate 412 in a tearing manner by lifting a removal starting portion 414 of the first plate 411 exposed to the open portion 415 in an upward direction by applying specific pressure.

According to various embodiments, a boundary line between the first plate 411 and the second plate 412 may be formed as a cut line 413. This is because the first plate 411 is removed by tearing up to a desired area in the upper surface 410 of the shield cover 400 with respect to the second plate 412.

According to various embodiments, the shield cover 400 may externally expose the removal starting portion 414 to start the removal of the first plate 411 by the open portion 415. According to one embodiment, the removal starting portion 414 may be formed of a bending piece which is bent in a downward direction after being extended in a specific length from the open portion 415. According to one embodiment, an end portion of the bending piece may be formed in a shape which is not higher than at least a height of a lateral surface. Therefore, the removal starting portion 414 of the bending shape can be simply gripped and lifted by a disassembling jig, and thus the first plate 411 can be easily separated from the shield cover 400.

Figure 4B:
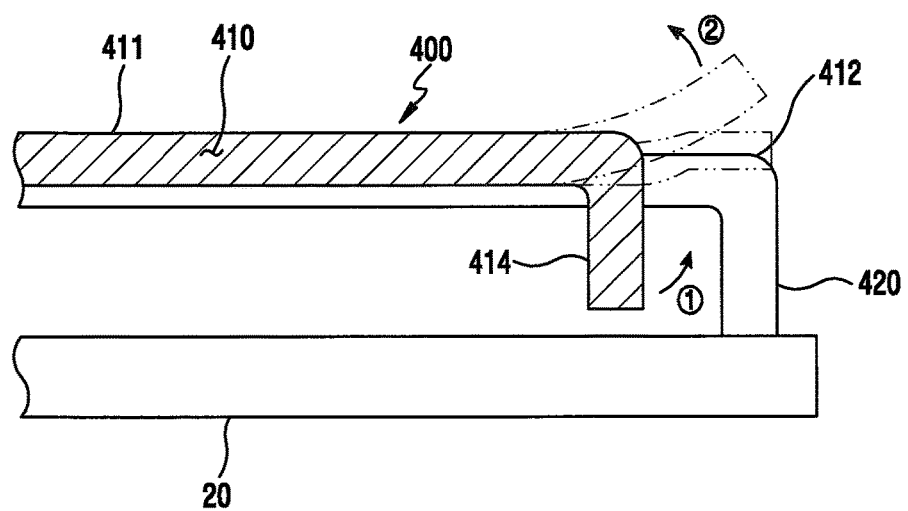
FIG. 4B is an operational diagram illustrating a state in which a shield cover is partially removed according to various embodiments of the present disclosure.

FIG. 4B is an operational diagram illustrating a state in which a shield cover 400 is partially removed according to various embodiments of the present disclosure. According to one embodiment, FIG. 4B illustrates a cross-section viewed along the line C-C' of FIG. 4A. Referring to FIG. 4B, the shield cover 400 may be disposed on a PCB 20, and a lower end portion of a lateral surface 420 of the shield cover 400 may be fixed to the PCB 20 through a soldering process. According to one embodiment, regarding a removal starting portion 414 of a first plate 411 in an upper surface 410 of the shield cover 400, a portion which is bent by a disassembly jig may be unfolded in a specific direction (a direction ① of FIG. 4B), and the first plate 411 may be easily separated from a second plate 412 due to force of lifting in an upward direction (a direction ② of FIG. 4B) by holing an end portion of the unfolded removal starting portion 414.

Figure 5A:
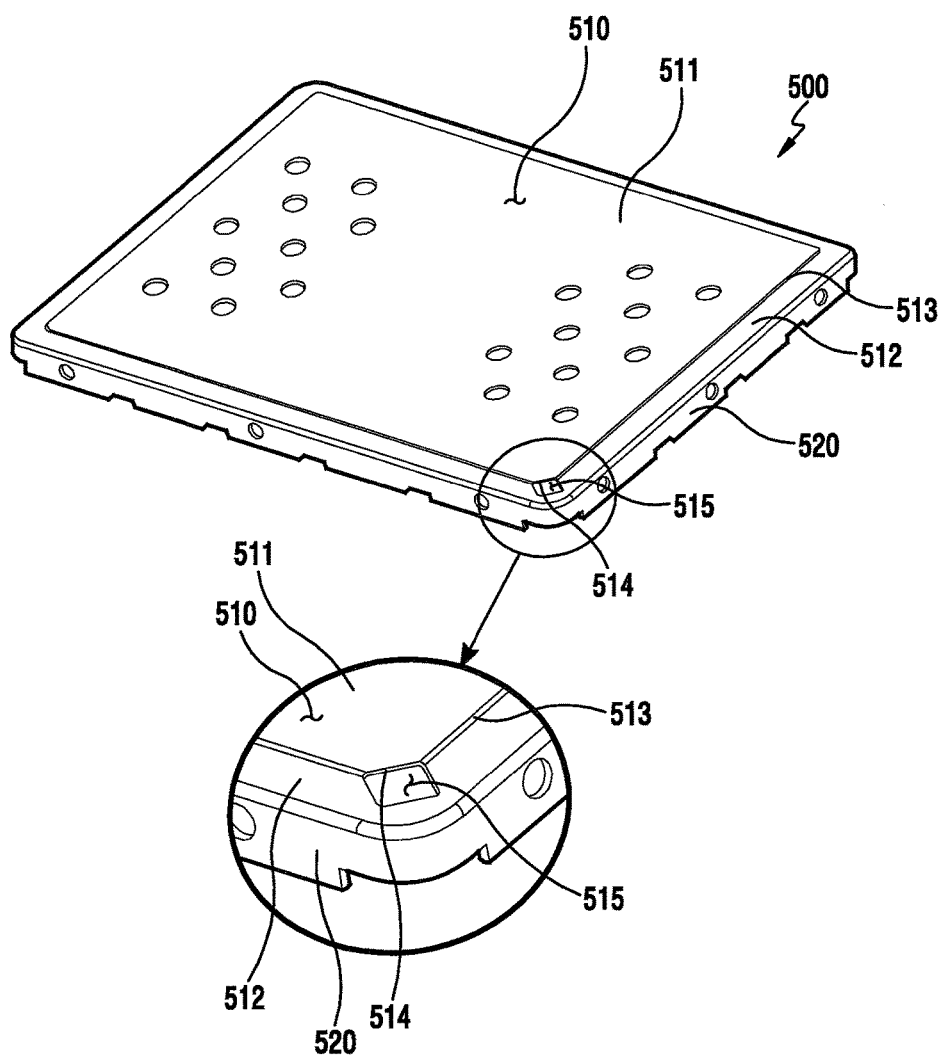
FIG. 5A illustrates a structure of a shield cover according to various embodiments of the present disclosure.

FIG. 5A illustrates a structure of a shield cover 500 according to various embodiments of the present disclosure.

Referring to FIG. 5A, the shield cover 500 may include an upper surface 510 formed in a roughly rectangular shape and a lateral surface 520 formed to have the same height along a boundary of the upper surface 510.

According to various embodiments, the upper surface 510 may include a first plate 511 to be removed for a repairing purpose and a second plate 512 extended from the lateral surface 520 remaining on a PCB even after the first plate 511 is removed. According to one embodiment, the second plate 512 may be extended in a central direction of the shield cover 500 along a boundary of the lateral surface 520. According to one embodiment, the first plate 511 may have the second plate 512 as a boundary, and may be roughly contributed as at least one area of a central portion.

According to various embodiments, a boundary line between the first plate 511 and the second plate 512 may be formed as a cut line 513. This is because the first plate 511 is removed by tearing up to a desired area in the upper surface 510 of the shield cover 500 with respect to the second plate 512.

According to various embodiments, an open portion 515 which is open to up to the first plate 511 in order to be removed for a repairing purpose may be formed to at least one corner of the shield cover 500. According to one embodiment, the open portion 515 may be formed to the second plate, and the removal starting portion 514 of the first plate 511 may be disposed in an exposed manner to at least one corner of the open portion 515. Therefore, the first plate 511 may be separated from the second plate 512 in a tearing manner by inserting an additional disassembly jig (530 of FIG. 5B and FIG. 5C) to the open portion 515 and thus by lifting the removal starting portion 514.

Figure 5B:
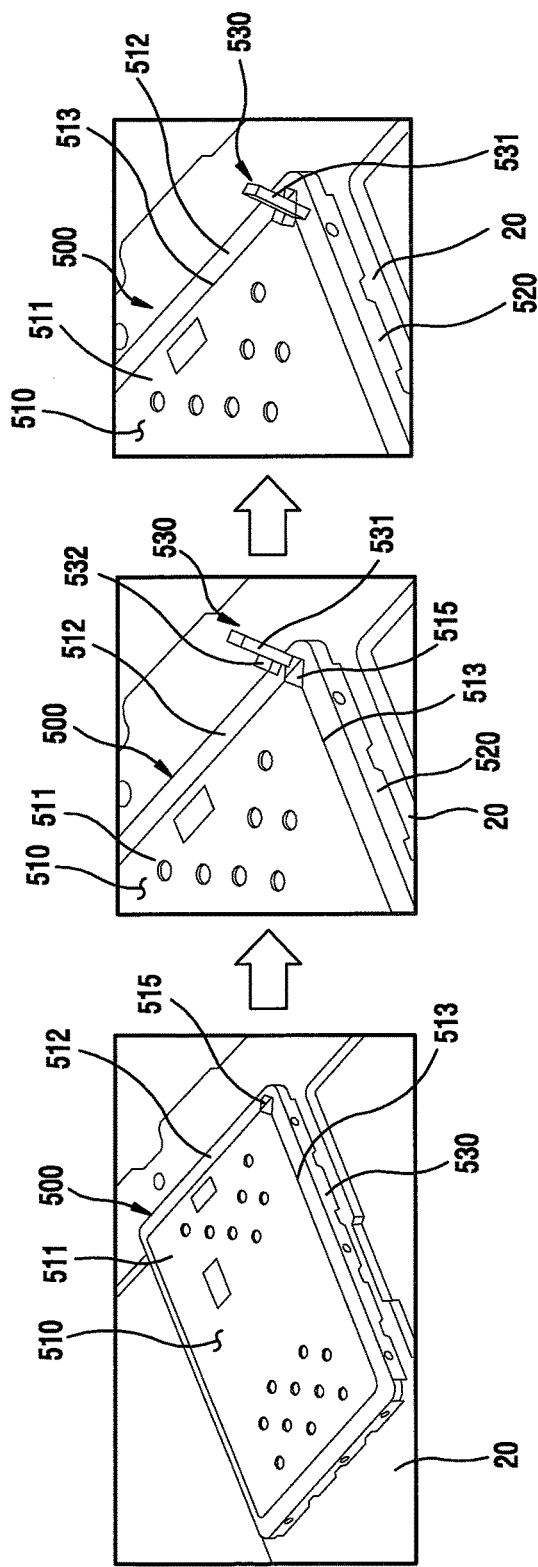
FIG. 5B and FIG. 5C are operational diagrams illustrating a state in which a shield cover is partially removed according to various embodiments of the present disclosure.
Figure 5C:
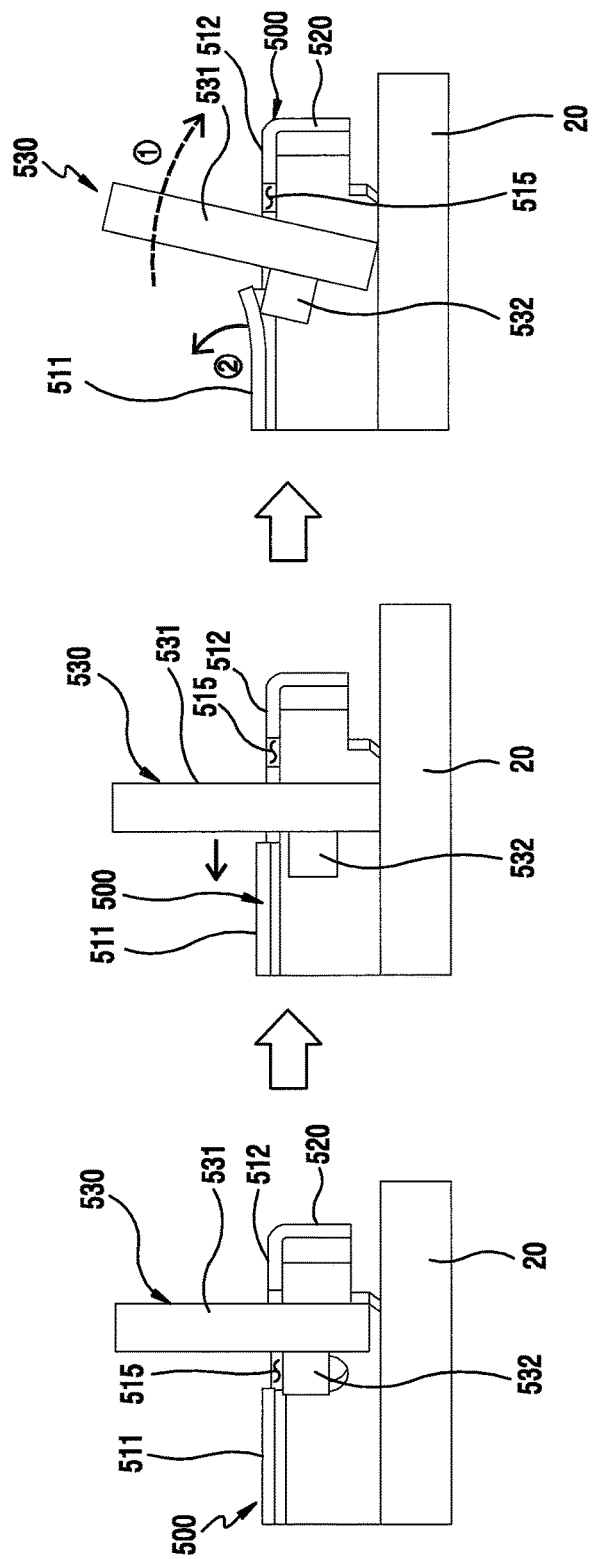

FIG. 5B and FIB. 5C are operational diagrams illustrating a state in which a shield cover 500 is partially removed according to various embodiments of the present disclosure.

Referring to FIG. 5B and FIB. 5C, the shield cover 500 may be disposed on a PCB 20, and a lower end portion of a lateral surface 520 of the shield cover 500 may be fixed to the PCB 20 through a soldering process. According to one embodiment, to remove a first plate 511 in an upper surface 510 of the shield cover 500, a disassembly jig 530 may be partially inserted to an open portion 515 formed on a second plate 512. According to one embodiment, the disassembly jig 530 may include a jig body 531 and a hooking piece 532 protruding from the jig body 531. According to one embodiment, the disassembly jig 530 may be inserted to up to the hooking piece 532 in the open portion 515 of the first plate 511. According to one embodiment, the disassembly jig 530 inserted to the open portion 515 may be disposed such that the hooking piece 532 is hooked to a lower surface of the first plate 511. Thereafter, when the jig body 531 of the disassembly jig 530 is moved in a direction ① of FIG. 5C by using a principle of a lever, the hooking piece 532 lifts the lower surface of the first plate 511 in a direction ② (in an upward direction) of FIG. 5C, and thus the first plate 511 can be easily separated from the second plate 512.

Figure 6:
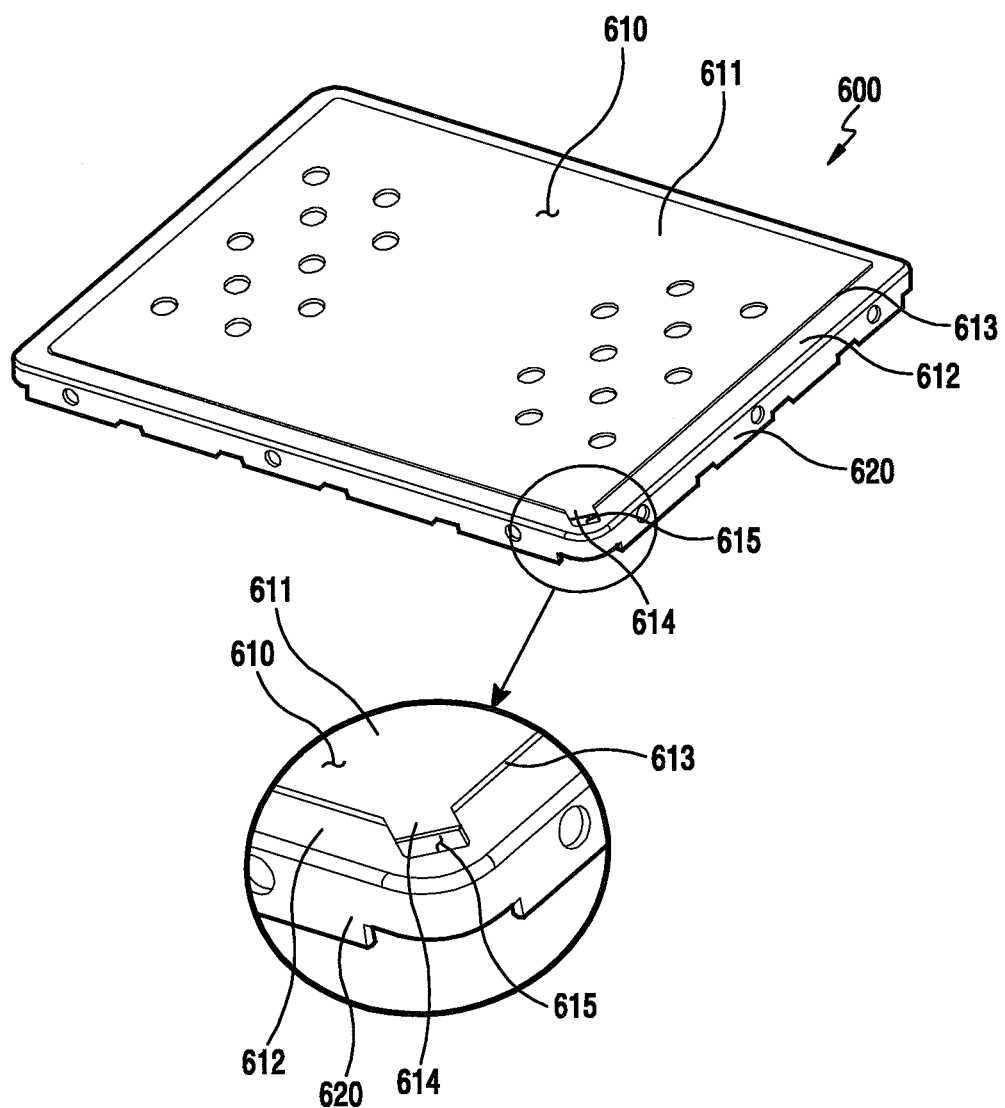
FIG. 6 illustrates a structure of a shield cover according to various embodiments of the present disclosure.

FIG. 6 illustrates a structure of a shield cover 600 according to various embodiments of the present disclosure.

Referring to FIG. 6, the shield cover 600 may include an upper surface 610 formed in a roughly rectangular shape and a lateral surface 620 formed to have the same height along a boundary of the upper surface 610.

According to various embodiments, the upper surface 610 may include a first plate 611 to be removed for a repairing purpose and a second plate 612 extended from the lateral surface 620 remaining on a PCB even after the first plate 611 is removed. According to one embodiment, the second plate 612 may be extended in a central direction of the shield cover 600 along a boundary of the lateral surface 620. According to one embodiment, the first plate 611 may have the second plate 612 as a boundary, and may be roughly contributed as at least one area of a central portion.

According to various embodiments, a boundary line between the first plate 611 and the second plate 612 may be formed as a cut line 613. This is because the first plate 611 is removed by tearing up to a desired area in the upper surface 610 of the shield cover 600 with respect to the second plate 612.

According to various embodiments, an open portion 615 which is open in order to be removed for a repairing purpose may be formed to at least one corner of the shield cover 600. According to one embodiment, the open portion 615 may be formed to the second plate 612, and the open portion 615 may include a removal starting potion 614 to which the first plate 611 is formed in an extended manner to up to at least one area of the open portion 615. Therefore, the first plate 611 may be separated from the second plate 612 in a tearing manner by inserting an additional disassembly jig (530 of FIG. 5B and FIG. 5C) to the open portion 515 and thus by lifting the removal starting portion 514.

Figure 7:
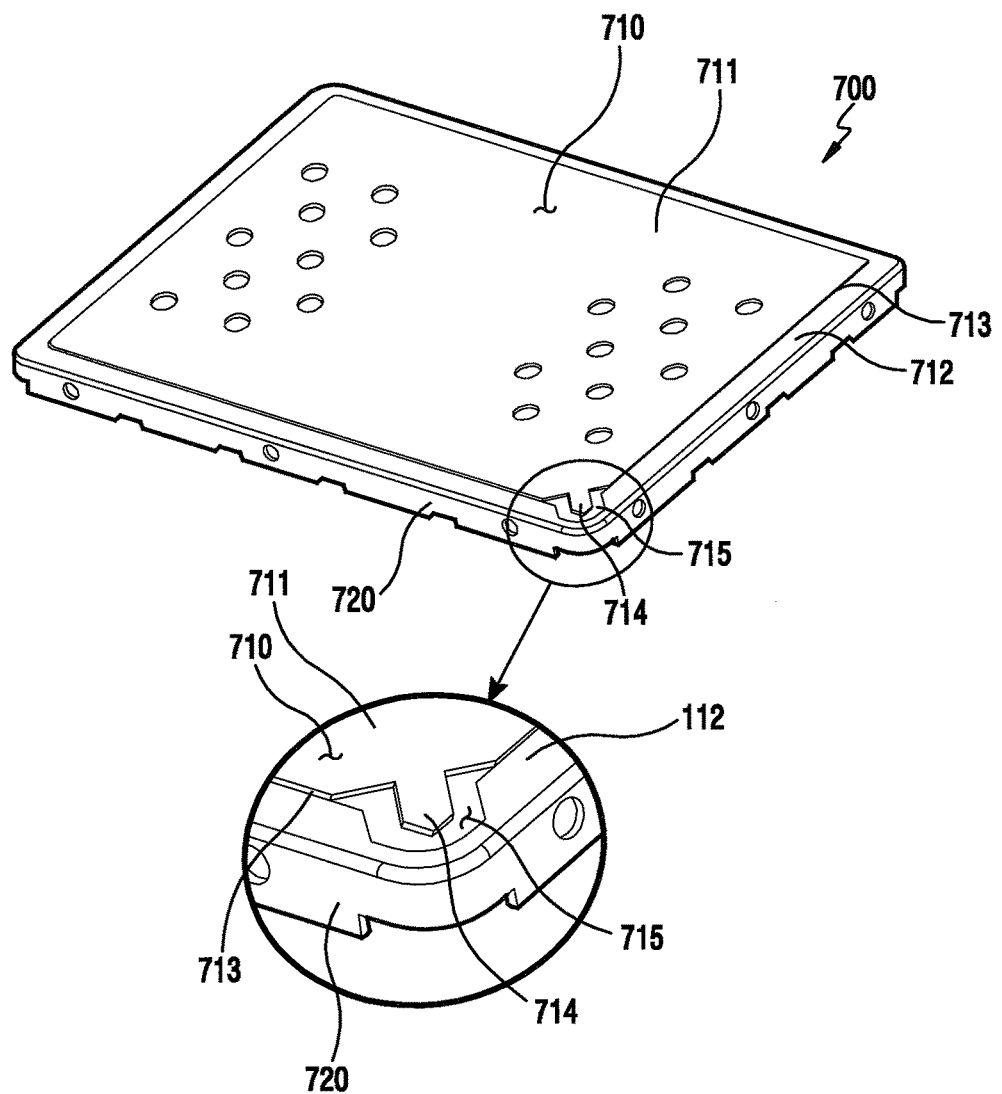
FIG. 7 illustrates a structure of a shield cover according to various embodiments of the present disclosure.

FIG. 7 illustrates a structure of a shield cover 700 according to various embodiments of the present disclosure.

Referring to FIG. 7, the shield cover 700 may include an upper surface 710 formed in a roughly rectangular shape and a lateral surface 720 formed to have the same height along a boundary of the upper surface 710.

According to various embodiments, the upper surface 710 may include a first plate 711 to be removed for a repairing purpose and a second plate 712 extended from the lateral surface 720 remaining on a PCB even after the first plate 711 is removed. According to one embodiment, the second plate 712 may be extended in a central direction of the shield cover 700 along a boundary of the lateral surface 720. According to one embodiment, the first plate 711 may have the second plate 712 as a boundary, and may be roughly contributed as at least one area of a central portion.

According to various embodiments, a boundary line between the first plate 711 and the second plate 712 may be formed as a cut line 713. This is because the first plate 711 is removed by tearing up to a desired area in the upper surface 710 of the shield cover 700 with respect to the second plate 712.

According to various embodiments, an open portion 715 which is open in order to be removed for a repairing purpose may be formed to at least one corner of the shield cover 700. According to one embodiment, the open portion 715 is formed to the second plate 712, and may be formed to be extended to one portion of an area of the first plate 711. According to one embodiment, a removal starting portion 714 extended by a specific length in a direction of the open portion 715 from the first plate 711 may be formed in a protrusion manner. According to one embodiment, the first plate 711 may be easily separated from the second plate 712 in such a manner that the removal starting portion 714 is lifted by an additional disassembly jig.

Figure 8A:
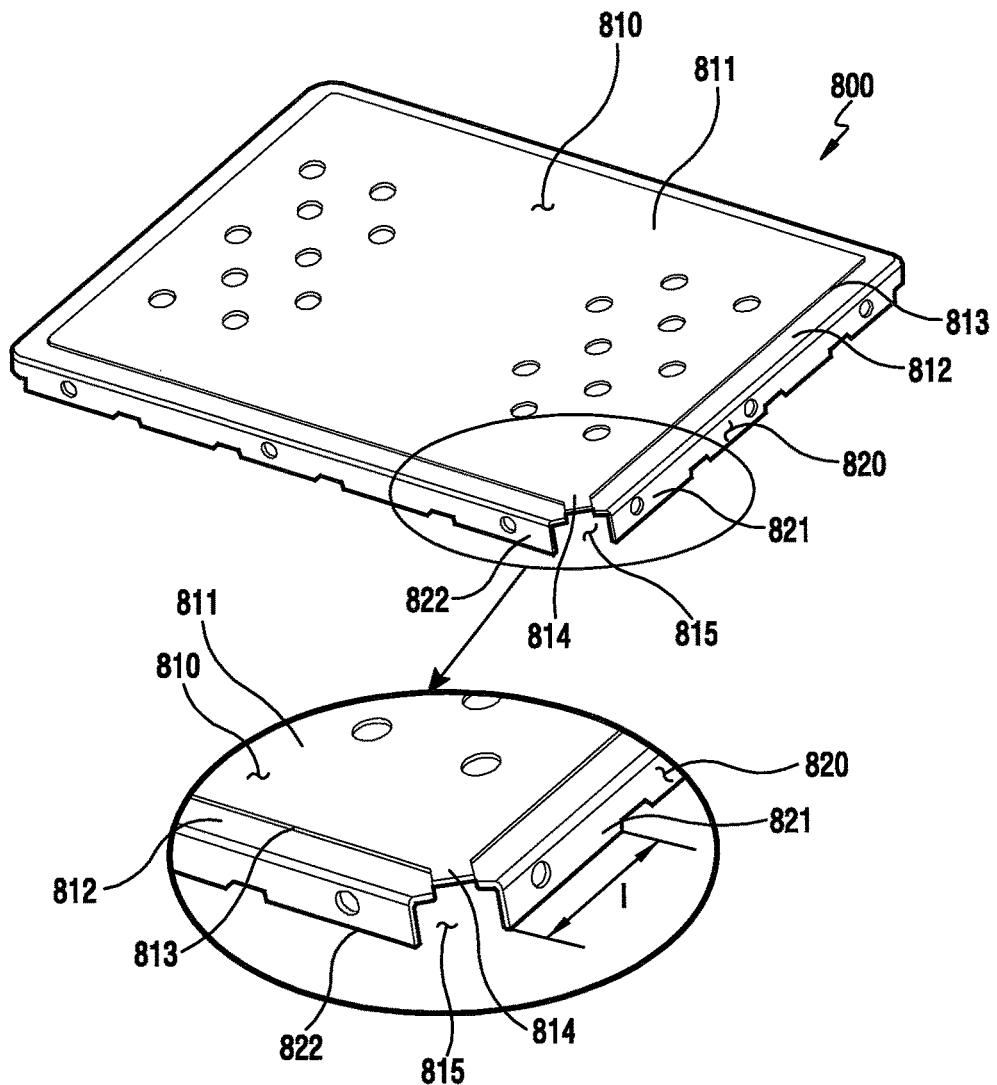
FIG. 8A and FIG. 8B illustrate a structure of a shield cover according to various embodiments of the present disclosure.
Figure 8B:
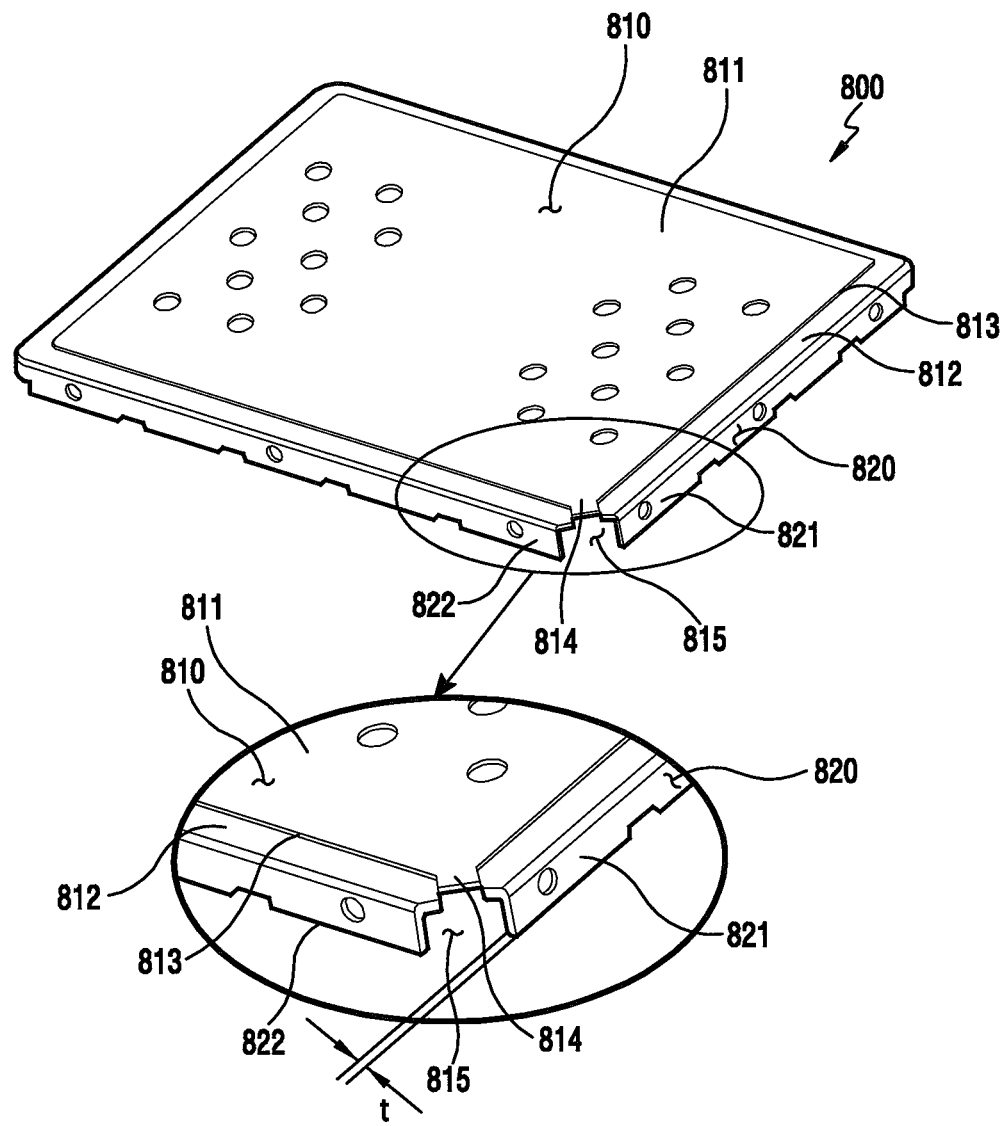

FIG. 8A and FIG. 8B illustrate a structure of a shield cover 800 according to various embodiments of the present disclosure.

Referring to FIG. 8A and FIG. 8B, the shield cover 800 may include an upper surface 810 formed in a roughly rectangular shape and a lateral surface 820 formed to have the same height along a boundary of the upper surface 810.

According to various embodiments, the upper surface 810 may include a first plate 811 to be removed for a repairing purpose and a second plate 812 extended from the lateral surface 820 remaining on a PCB even after the first plate 811 is removed. According to one embodiment, the second plate 812 may be extended in a central direction of the shield cover 800 along a boundary of the lateral surface 820. According to one embodiment, the first plate 811 may have the second plate 812 as a boundary, and may be roughly contributed as at least one area of a central portion.

According to various embodiments, a boundary line between the first plate 811 and the second plate 812 may be formed as a cut line 813. This is because the first plate 811 is removed by tearing up to a desired area in the upper surface 810 of the shield cover 800 with respect to the second plate 812.

According to various embodiments, in order to separate the first plate 811 of the shield cover 800 from the second plate 812, a removal starting portion 814 similar to the structure of FIG. 1C may be disposed to an open portion 815 formed to a corner of one side of the shield cover 800. However, without being limited thereto, the removal starting portion may include various removal starting portions 414, 514, 614, and 714 respectively disclosed in the aforementioned various embodiments.

According to various embodiments, in the shield cover 800, when the first plate 811 is separated from the second plate 812 by the removal starting point 814, the lateral surface 820 including the second plate 812 maintains a soldering state while reducing a crack phenomenon on a PCB. Therefore, a lateral surface around the removal starting portion 814 in the lateral surface 820, for example, lateral portions 821 and 822 disposed at both sides of the open portion, is soldered by more extending a contact area with the PCB than other lateral surfaces.

According to the aforementioned description, the lateral portions 821 and 822 disposed at both sides of the open portion 815 may be more extended in a length 1 and/or a thickness i than other lateral surfaces to extend a contact area for soldering with the PCB.

Figure 9A:
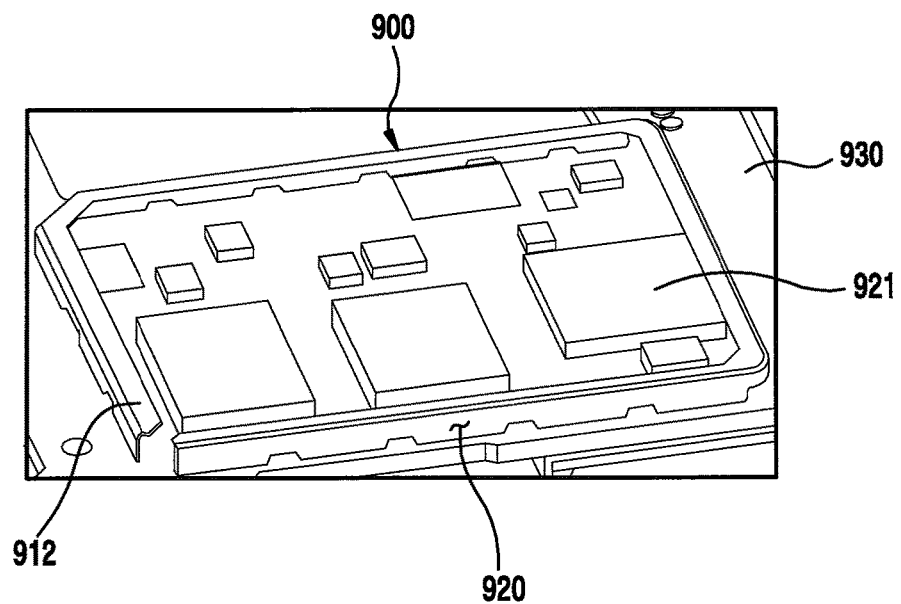
FIG. 9A and FIG. 9B illustrate a structure of repairing a removed area of a shield cover according to various embodiments of the present disclosure.
Figure 9B:
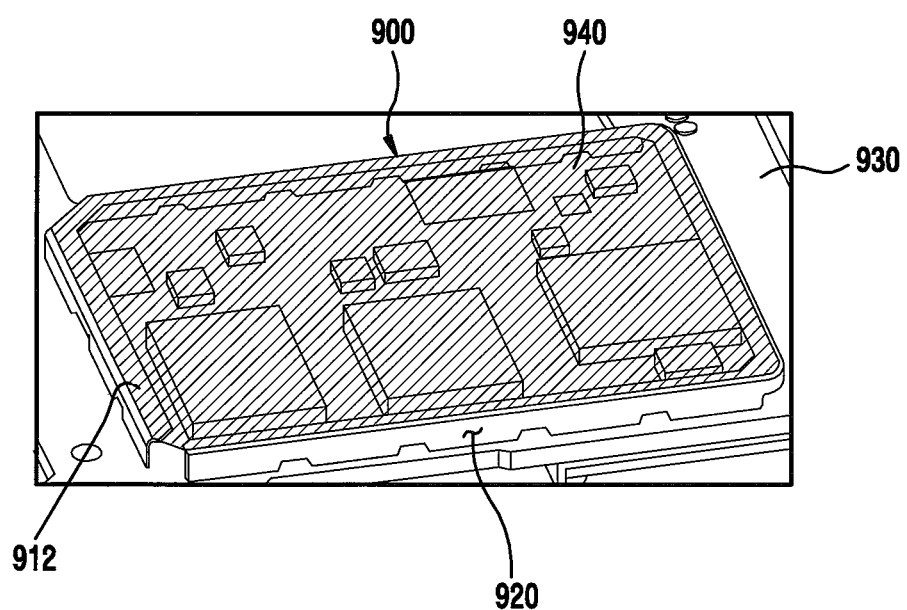

FIG. 9A and FIG. 9B illustrate a structure of repairing a removed area of a shield cover 900 according to various embodiments of the present disclosure.

Referring to FIG. 9A, it is shown a state in which the shield cover 900 is fixed to a PCB 930 on which at least one electronic component 821 is mounted. According to one embodiment, the electronic component 821 may be disposed inside a shielding area which is restricted by a lateral surface 920 of the shield cover 900 or a second plate 912 extended in a central direction of the shield cover 900 from the lateral surface 920. According to one embodiment, the first plate in the upper surface of the shield cover 900 may be removed for repairing.

Referring to FIG. 9B, after the repairing (e.g., replacing, fixing, etc.) of the electronic component is complete, a shield film 940 may be covered in a region in which the first plate of the shield cover 900 is removed. According to one embodiment, a conductive tape or the like may be used as the shield film 940, and a boundary portion of the shield film 940 may be fixed in a manner of being attached to the second plate 912.

Figure 10:
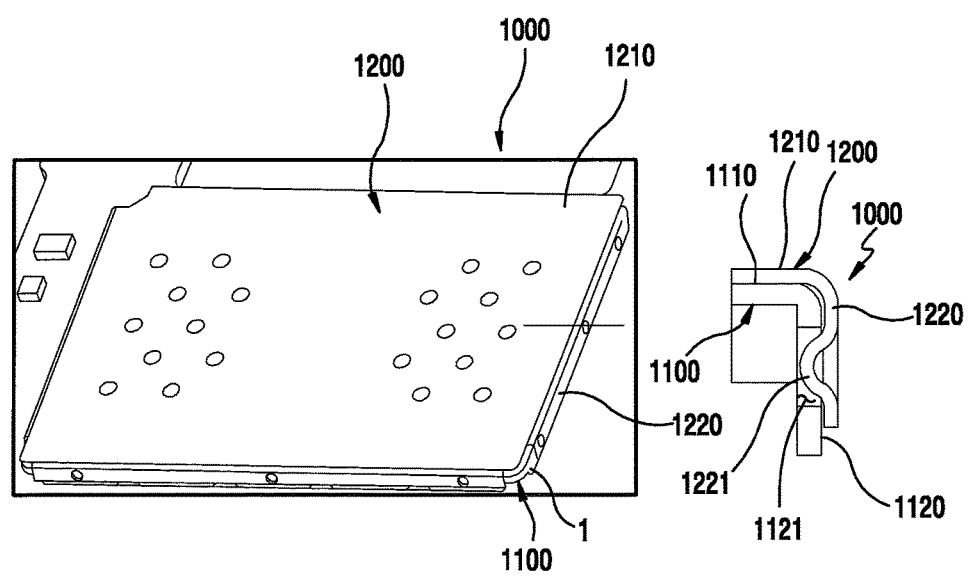
FIG. 10 illustrates a structure of repairing a removed area of a shield cover according to various embodiments of the present disclosure.

FIG. 10 illustrates a structure of repairing a removed area of a shield cover 1000 according to various embodiments of the present disclosure.

Referring to FIG. 10, it is shown a state in which an additional repair shield cover 1200 is installed after a first plate is removed from the shield cover 1000 fixed to a PCB. According to one embodiment, the repair shield cover 1200 may include an upper surface 1210 and a lateral surface 1220 to cover an upper surface 1110 and lateral surface 1120 of the shield cover 1000.

According to various embodiments, at least one recess 1121 may be formed to the lateral surface of the shield cover 1000, and a tension protrusion 1221 for being mounted to the recess 1121 may be formed to a corresponding inner side of the lateral surface 1220 of the repair shield cover 1200. Therefore, when it is placed to the shield cover 1000, the repair shield cover 1200 may be strongly fixed because the tension protrusion 1121 is mounted to the recess 1121 while comprising specific elasticity.

According to various embodiments, one portion of the shield cover can be easily removed by transforming a removal starting potion, thereby avoiding or reducing transformation of a portion remaining in the PCB and a crack of a soldering area.

According to various embodiments, there may be provided an electronic device including a housing including a first surface directed in a first direction, and a second surface directed in a second direction opposite to the first direction; a Printed Circuit Board (PCB) included in the housing, and including a first surface directed in the first direction and a second surface directed in the second direction; at least one electronic component disposed on the second surface of the PCB; and a shield structure for electromagnetically shielding the at least one electronic component, wherein the shield structure includes a metal plate which covers the at least one electronic component, from a top view of the second surface of the PCB, wherein the metal plate includes: a first portion for at least partially forming an external area of the metal plate, and including at least one open area; and a second portion for at least partially forming a central area of the metal plate, and including a second portion which more protrudes in the second direction than the first portion, from a side view of the metal plate, wherein a part of the second portion is disposed to the open area of the first portion, and from a top view of the metal plate, the part of second portion protrudes or is recessed more than a virtual line defined by a part of the first portion in proximity to the open area.

According to various embodiments, the shield structure may include a sidewall at least partially surrounding a space between the metal place and the second surface of the PCB.

According to various embodiments, the sidewall may be formed by bending one portion extended from an edge of the first portion of the metal place in the first direction.

According to various embodiments, the open area of the first portion may be formed to a corner of the metal plate.

According to various embodiments, a border portion between the first portion and the second portion may be formed to be thinner than a thickness of the first portion and/or a thickness of the second portion.

According to various embodiments, there may be provided an electronic device including: a housing comprising a first surface directed in a first direction, and a second surface directed in a second direction opposite to the first direction; a Printed Circuit Board (PCB) comprised in the housing, and comprising a first surface directed in the first direction and a second surface directed in the second direction; at least one electronic component disposed on the second surface of the PCB; and a shield structure for electromagnetically shielding the at least one electronic component, wherein the shield structure comprises a metal plate which covers the at least one electronic component, from a top view of the second surface of the PCB, wherein the metal plate comprises: a first portion for at least partially forming an external area of the metal plate; a second portion for at least partially forming a central area of the metal plate, and comprising a second portion which more protrudes than the first portion, from a side view of the metal plate; and at least one open portion disposed to at least one corner of the metal plate, and defined by a part of the first portion and a part of the second portion.

According to various embodiments, there may be provided an electronic device including: a housing; a Printed Circuit Board (PCB) comprised in the housing, and comprising a first surface directed in a first direction and a second surface directed in a second direction opposite to the first direction; at least one electronic component disposed on the second surface of the PCB; and a shield structure for electromagnetically shielding the at least one electronic component, wherein the shied structure comprises: an upper plate which covers the at least one electronic component, from a top view of the second surface of the PCB; and a sidewall structure formed in an integral manner with the upper plate, and covering at least partially surrounding a space between the upper plate and the second surface of the PCB, wherein a surface directed in the second direction of the upper plate more protrudes in the second direction than a surface directed in the second direction of the sidewall, wherein a cut extended at one portion of an edge of the upper plate is formed at one portion of an edge of the sidewall, from a top view of the second surface of the PCB, and wherein one portion of the edge of the upper plate is more recessed towards the upper plate than an outline of the cut, and protrudes in an opposite direction of the upper plate, from a top view of the second surface of the PCB.

Each of constitutional elements described in the present disclosure may consist of one or more components, and names of the constitutional elements may vary depending on a type of an electronic device. The electronic device according to various embodiments may include at least one of the constitutional elements described in the present disclosure. Some of the constitutional elements may be omitted, or additional other constitutional elements may be further included. In addition, some of the constitutional elements of the electronic device according to the various embodiments described herein may be combined and constructed to one entity, so as to equally perform functions of corresponding constitutional elements before combination.

Although the present disclosure has been described with various exemplary embodiments, various changes and modifications may be suggested to one skilled in the art. It is intended that the present disclosure encompass such changes and modifications as fall within the scope of the appended claims.

What is claimed is:

1. An electronic device comprising:
   a housing comprising a first surface directed in a first direction, and a second surface directed in a second direction opposite to the first direction;
   a Printed Circuit Board (PCB) disposed in the housing, and comprising a first surface directed in the first direction and a second surface directed in the second direction;
   at least one electronic component disposed on the second surface of the PCB; and
   a shield structure configured to electromagnetically shield the at least one electronic component,
   wherein the shield structure comprises a metal plate which, from a top view of the second surface of the PCB, is configured to cover the at least one electronic component,
   wherein the metal plate comprises:
      a first portion configured to at least partially form an external area of the metal plate, and comprising at least one open area; and
      a second portion configured to at least partially form a central area of the metal plate, and wherein the second portion is configured to protrude, from a side view of the metal plate, in the second direction more than the first portion,
      wherein a part of the second portion is disposed to the at least one open area of the first portion, and from a top view of the metal plate, the part of the second portion protrudes or is recessed more than a virtual line defined by a part of the first portion in proximity to the open area.

2. The electronic device of claim 1, wherein the shield structure further comprises a sidewall at least partially surrounding a space between the metal plate and the second surface of the PCB.

3. The electronic device of claim 2, wherein the sidewall is formed by bending one portion extended from an edge of the first portion of the metal plate in the first direction.

4. The electronic device of claim 1, wherein the open area of the first portion is configured to be disposed at a corner of the metal plate.

5. The electronic device of claim 1, wherein a border portion disposed between the first portion and the second portion is thinner than a first thickness of the first portion or a second thickness of the second portion.

6. An electronic device comprising:
   a housing comprising a first surface directed in a first direction, and a second surface directed in a second direction opposite to the first direction;
   a Printed Circuit Board (PCB) comprised in the housing, and comprising a first surface directed in the first direction and a second surface directed in the second direction;
   at least one electronic component disposed on the second surface of the PCB; and
   a shield structure for electromagnetically shielding the at least one electronic component,
   wherein the shield structure comprises a metal plate which is configured to cover the at least one electronic component, from a top view of the second surface of the PCB,
   wherein the metal plate comprises:
      a first portion configured to at least partially form an external area of the metal plate;
      a second portion configured to at least partially form a central area of the metal plate, and comprising a third portion which is configured to protrude, and which, from a side view of the metal plate, protrudes more than the first portion; and
      at least one open portion disposed to at least one corner of the metal plate, and defined by a part of the first portion and a part of the second portion.

7. An electronic device comprising:
   a housing;
   a Printed Circuit Board (PCB) disposed in the housing, and comprising a first surface directed in a first direction and a second surface directed in a second direction opposite to the first direction;
   at least one electronic component disposed on the second surface of the PCB; and
   a shield structure configured to electromagnetically shield the at least one electronic component,
   wherein the shield structure comprises:
      an upper plate which, from a top view of the second surface of the PCB, is configured to cover the at least one electronic component; and
      a sidewall structure formed in an integral manner with the upper plate, and configured to cover and at least partially surround a space between the upper plate and the second surface of the PCB;
      wherein a third surface of the upper plate directed in the second direction protrudes in the second direction more than a fourth surface of the sidewall structure directed in the second direction;,
      wherein, from a top view of the second surface of the PCB, a cut extended at a first portion of a first edge of the upper plate is formed at a second portion of a second edge of the sidewall structure; and
      wherein one portion of the first edge of the upper plate is more recessed towards the upper plate than an outline of the cut, and from a top view of the second surface of the PCB, is configured to protrude in an opposite direction of the upper plate.

8. An electronic device comprising:
   a Printed Circuit Board (PCB);
   at least one electronic component mounted in a shielding area of the PCB; and
   a shield cover comprising a metal material and fixed to an upper surface of the PCB is configured to shield the shielding area, wherein the shield cover comprises:
      an upper surface comprising a first plate and a second plate configured to be extended along a boundary of the first plate;
      a lateral surface which is configured to have a constant height along a boundary of the second plate; and
      an open portion configured to be exposed to up to one area of the first plate through the second plate from the lateral surface,
      wherein an exposed area of the first plate is exposed to a notch-shaped space configured to be more inwardly recessed than a virtual extension line of an outer boundary of the second plate in the open portion.

9. The electronic device of claim 8, wherein a first boundary line between the first plate and the second plate is configured to be relatively thinner than a thickness of a neighboring plate so that cutting is possible.

10. The electronic device of claim 9, wherein the first plate is configured to be separated from the second plate in a tearing manner according to the first boundary line, wherein the tearing can start at an area of the first plate exposed in the open portion.

11. The electronic device of claim 10, further comprising a repair member installed to an upper portion of the second plate and configured to shield the shielding area, wherein the repair member is configured to be installed after the first plate is separated.

12. The electronic device of claim 11, wherein the repair member comprises a shield film attached to the second plate or a repair shield cover configured to surround the second plate.

13. The electronic device of claim 12, wherein the repair shield cover comprises at least one tension protrusion formed to an inner side of a lateral surface of the repair shield cover, and the at least one tension protrusion is placed to a recess formed at a corresponding position of an outer side of the lateral surface of the repair shield cover.

14. The electronic device of claim 9, wherein the first boundary line comprises a cut notch formed to at least one of the upper surface of the shield cover or a lower surface of the shield cover facing the upper surface of the shield cover so that the cut notch is lower than a surface of the neighboring plate.

15. The electronic device of claim 8, wherein the notch-shaped space is configured to be extended to up to at least one area of the first plate.

16. The electronic device of claim 8, wherein the up to one area of the first plate exposed by the open portion comprises a bending piece which is configured to be bent in a downward direction after being extended outwardly.

17. An electronic device comprising:
a Printed Circuit Board (PCB);
at least one electronic component mounted in a shielding area of the PCB; and
a shield cover comprising a metal material and fixed to an upper surface of the PCB is configured to shield the shielding area, wherein the shield cover comprises:
an upper surface comprising a first plate and a second plate, formed as an integrated component of the first plate, configured to be extended along a boundary of the first plate;
a lateral surface which is configured to have a constant height along a boundary of the second plate; and
an open portion configured to expose one area of the first plate in the second plate,
wherein the first plate is configured to be separated from the second plate using a part of the first plate exposed in the open portion.

18. The electronic device of claim 17, wherein one area of the first plate is configured to be extended to at least one area of the open portion.

19. The electronic device of claim 17, wherein the open portion is configured to be extended to up to at least one area of the first plate.

20. The electronic device of claim 17, wherein the first plate is configured to be inserted into the open portion and thereafter separated from the second plate by a disassembly jig configured to operate as a lever.

* * * * *